(12) United States Patent
Meyer et al.

(10) Patent No.: US 11,342,939 B2
(45) Date of Patent: May 24, 2022

(54) PROCESSING OF DATA READ FROM A MEMORY

(71) Applicant: Infineon Technologies AG, Neubiberg (DE)

(72) Inventors: Bernd Meyer, Munich (DE); Gerd Dirscherl, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/986,300

(22) Filed: Aug. 6, 2020

(65) Prior Publication Data
US 2021/0044306 A1 Feb. 11, 2021

(30) Foreign Application Priority Data
Aug. 7, 2019 (DE) ...................... 10 2019 121 286.3

(51) Int. Cl.
*G11C 29/00* (2006.01)
*H03M 13/15* (2006.01)
*G06F 11/10* (2006.01)
*H03M 13/00* (2006.01)

(52) U.S. Cl.
CPC ..... *H03M 13/1575* (2013.01); *G06F 11/1068* (2013.01); *H03M 13/616* (2013.01)

(58) Field of Classification Search
CPC .......................... H03M 13/1575; H03M 13/616
See application file for complete search history.

(56) References Cited

U.S. PATENT DOCUMENTS

| | | | | |
|---|---|---|---|---|
| 4,468,770 A * | 8/1984 | Metcalf | ................. | H04L 1/0057 375/362 |
| 6,195,780 B1 * | 2/2001 | Dravida | .............. | H03M 13/091 714/758 |
| 6,480,936 B1 * | 11/2002 | Ban | ........................ | G06F 3/061 711/113 |
| 2014/0195881 A1 * | 7/2014 | Srivastava | ............ | H03M 13/15 714/782 |

OTHER PUBLICATIONS

German Office Action issued for corresponding German patent application DE10 2019 121 286.3, dated Mar. 17, 2020, 6 pages (for informational purpose only).
Wikipedia; "Error Correction Code"; https://en.wikipedia.org/w/index.php?title=Error_correction_code&oldid=907702253; Wikipedia; retrieved Mar. 17, 2020; 12 pages.
Wikipedia; "Checksum"; https://en.wikipedia.org/w/index.php?title=Checksum&oldid=895355035; Wikipedia; retrieved Mar. 17, 2020; 4 pages.

* cited by examiner

*Primary Examiner* — Samir W Rizk
(74) *Attorney, Agent, or Firm* — Viering, Jentschura & Partner mbB

(57) ABSTRACT

It is proposed to divide data read from a memory into groups and to perform a syndrome calculation iteratively based on each of the individual groups. The syndromes may be calculated by means of random access to the individual groups.

16 Claims, 2 Drawing Sheets

PROCESSING OF DATA READ FROM A MEMORY

CROSS-REFERENCE TO RELATED APPLICATIONS

This application claims priority to DE Application 10 2019 121 286.3, which was filed on Aug. 7, 2019, the entire contents of which are hereby incorporated herein by reference.

TECHNICAL FIELD

This disclosure relates to the efficient processing of data read from a memory.

BACKGROUND

It is desired to provide a flexible and possibly more fault-tolerant way to handle data that are read from a memory.

BRIEF SUMMARY

To achieve the object, a method is proposed for processing data from a memory in which the read data are divided into groups; in which a syndrome calculation is performed iteratively based on each of the individual groups; the syndromes being calculated by means of random access to the individual groups.

The sequence of the processing of the groups for the syndrome calculation can be carried out in a flexible manner according to different (varying) specifications. This means that the syndrome calculation of the sequence of the groups is different from the specified order of the groups, i.e. at least two adjacent groups are not processed in direct succession.

According to an aspect of the disclosure, an error syndrome is determined based on the iterative syndrome calculation; the error syndrome is used to determine whether a code word is present; and an error is detected and/or corrected if there is no code word present.

DETAILED DESCRIPTION

Figure 1:
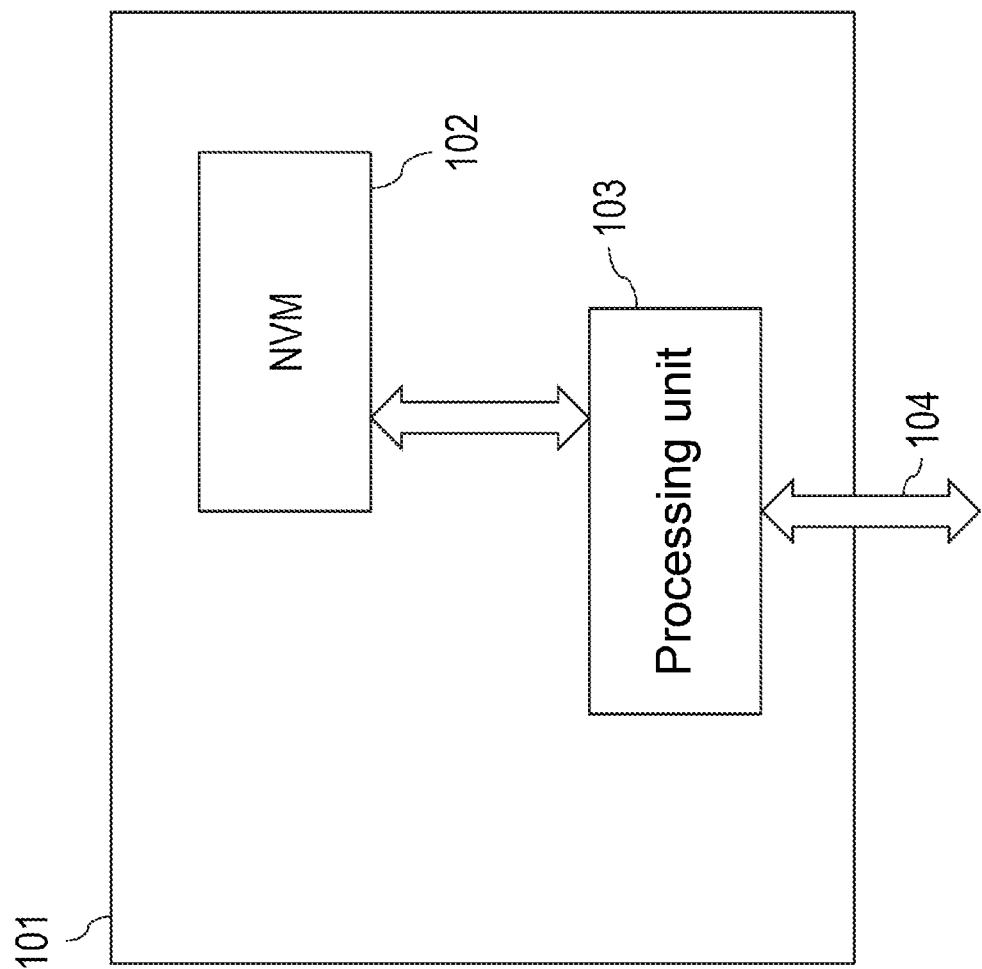
FIG. 1 shows an example arrangement including a security circuit with a non-volatile memory and a processing unit.

The error syndrome is an error syndrome of an error code. The error code can be an error-detecting and/or error-correcting code. In particular, a cyclic code can be used as an error code. In another extension, the random access to the individual groups may be carried out by accessing the individual groups in an arbitrary order.

In another extension, the random access to the individual groups may be carried out by first processing a group that does not contain the first or the last bit of the data.

In a further extension the random access to the individual groups may be carried out cyclically in ascending or descending order, wherein a cyclic wrap-around is carried out at the end of the data.

In this case, cyclic wrap-around means that in the case of an ascending sequence of groups, after processing the last group of data, the processing may be continued with the first group of data. Accordingly, in the case of a descending sequence of groups, after processing the first group of data the processing can be continued with the last group of data.

In another extension, the random access to the individual groups may be carried out cyclically in ascending and descending order.

In another extension, a cyclic wrap-around may be carried out at the end of the data. In another extension, the syndrome calculation may be carried out iteratively using at least one correction matrix.

In another extension, syndromes of a cyclical code may be determined during the syndrome calculation.

In another extension, the syndromes may be calculated iteratively based on each of the individual groups by using the correction matrix $M_k$ per group, wherein each correction matrix corresponds to syndromes of symbol strings rotated by a specified number of positions. In another extension, the syndromes may be calculated iteratively based on each of the individual groups by using the correction matrix $M_k$ per group, wherein the i-th column of the correction matrix $$M_k \in GF(2)^{deg(g) \times b}$$

contains a coefficient vector of the reduced remainder of the polynomial division $$x^{k+deg(g)-i} \bmod g(x) \text{ for } 1 \leq i \leq deg(g)$$

for a given integer k and a generator polynomial g(x) of the code.

These operations correspond to rotations of the sequence of the processed groups to the left or right and allow the data words to be processed in any order.

The matrix multiplication over GF(2) in a hardware implementation can be reduced to the calculation of XOR sums of coefficients of the respective bit vectors.

In an extension, the memory is a non-volatile memory, in particular an RRAM. In an extension, the memory is part of an electronic security circuit. The security circuit can be a security module.

Additionally, a device is proposed for processing data read from a memory, including a processing unit that is configured to perform the following steps:

dividing the read data into groups,
iteratively performing a syndrome calculation based on each of the individual groups,
the syndromes being calculated by means of random access to the individual groups.

The processing unit mentioned here may be embodied, in particular, as a processor unit and/or an at least partially hard-wired or logical circuit arrangement, which may be configured, for example, in such a way that the method can be carried out as described herein. Said processing unit can be or include any type of processor or calculator or computer with the necessary peripheral devices (memory, input/output interfaces, input and output devices, etc.).

The above remarks relating to the method apply to the device as appropriate. The device can be embodied in one component or divided into a plurality of components.

In an extension, the device may be an electronic security circuit and the memory is part of the device.

Also, the above-mentioned object may be achieved by means of a system including at least one of the devices described here.

The solution presented here also includes a computer program product that can be loaded directly into a memory of a digital computer, including program code parts which are suitable for carrying out steps of the method described here.

In addition, the above object is achieved using a non-transitory computer-readable storage medium, e.g. any desired memory, including instructions executable by a computer (e.g. in the form of program code) which are suitable for enabling the computer to carry out the steps of the method described here.

The properties, features and advantages of the present disclosure described above and the manner in which these are achieved are also described in conjunction with the following schematic description of exemplary embodiments, which are explained in more detail in conjunction with the drawings. For clarity of exposition, identical or equivalent functional elements are labeled with the same reference signs.

FIG. 1 shows an example arrangement including a security circuit 101 (also referred to as "Security-IC") with a non-volatile memory (NVM) 102, which can be implemented, for example, as an RRAM (Resistive Random Access Memory). Additionally, a processing unit 103 is provided, which can access the memory 102 and can provide results of the access and/or processed data either internally or externally (indicated by an arrow 104).

In principle, the processing unit 103 can communicate with other components (not shown) of the security circuit 101 or with external components in a unidirectional or bi-directional manner.

In particular, the security circuit 101 may be designed in such a way that no or only specific information from the memory 102 is passed to the outside. For example, the security circuit 101 may contain keys or key information that should not leave the security circuit 101.

The use of a RRAM as a non-volatile memory in integrated security circuits places high demands on the mechanism used for detecting and correcting bit errors in the stored data.

For secure operation of the memory, an error-correcting code (ECC), which detects and corrects bit errors (for example, all 1- to 3-bit errors) may be required. Such error detection and/or correction may be carried out using the processing unit 103. This means that the minimum distance of the code used must be relatively large (for example, at least 7 for correcting 3-bit errors). The number of error cases of such a code to be corrected should be of a similar size in order to tabulate all the associated syndromes or to decode and process them in parallel in hardware. Therefore, cyclic algebraic codes such as BCH or Reed-Solomon codes are preferably used for this application. The encoding of messages to be stored and the decoding and error correction of read messages may then be described by means of calculations in a polynomial ring over a finite field. This may be carried out by the hardware of the security IC.

For efficiency reasons, the code words used to correct errors in non-volatile memory contents often consist of multiple data words, for example, in the word length of the connected processor unit (CPU). For example, a code word may consist of 8 or 16 data words, each with 32 bits of data. This means that read and write operations generally require the transfer of many data words from or to the non-volatile memory before a memory controller is able to verify the correctness of an individual code word or update the redundancy information. This results in relatively large latencies in the calculation and checking of the code words, even if only individual data words of a code word are to be read or written by the CPU.

A similar situation may occur if the non-volatile memory is connected to the system by means of a write and/or read cache. In this case, it may be advantageous if the length of the code words used is equal to the size of a cache line.

A further example of the application of multi-bit correction codes to other storage technologies (e.g. FLASH, EEPROM, etc.) are products with very low error rates.

As examples, techniques for implementing cyclic algebraic codes such as BCH or Reed-Solomon codes will be described. This approach may allow a processing unit (e.g. the CPU) to gain write or read access to data words of a code word in any order, without causing additional latencies in the calculation or checking of the redundancy information of the code word.

Such an implementation may allow, for example, the speculative execution or processing of the information in the data words of a code word while the code word of the non-volatile memory is being read or written and the calculation or checking of the redundancy information of the code word is not yet completed. In this way, it may be possible to cryptographically process the data words of the code word speculatively while they are being transferred to a cache. Once the code word has been read completely and checked for correctness, some of the data words contained in it may have already been decrypted and the CPU can access the associated decrypted data in random order. In the event of an error, the read code word is corrected (assuming this is possible), the state of the cache and the affected data processing units is reset, and the processing of the data words contained is repeated with the corrected data. This approach reduces (on average) the overall latency of memory access and improves performance, provided data errors tend to occur rarely.

BCH codes and Reed-Solomon codes are known.

In the following, examples of linear codes are considered in terms of bit strings. However, the approach presented here is not limited to bit strings and can also be applied to codes using other symbol strings (e.g. elements of a finite field or extension field).

Decoding of a linear code generally begins by applying a check matrix of the code to a received (e.g. read) bit string. If the bit string corresponds to a code word of an error code, then the error code does not detect (and/or correct) any error. The error code in this case can be an error-correcting and/or error-detecting code. If the bit string is a code word, this error code cannot detect an error and it is assumed that there is no error present.

The result of the calculation of the check matrix is the syndrome of the bit string. For example, an error-free bit string has a syndrome with a value of 0. Conversely, each error to be detected and/or corrected corresponds to a syndrome value not equal to 0. If the mapping between an error and the corresponding syndrome value is unique and known, the errors in the bit string can be corrected.

In the case of non-cyclic codes or if the length of the code words is comparatively small, a fully parallel calculation of the syndrome is often used. In these cases, the check matrix is not very large and the result of applying the check matrix to the received message can be calculated in parallel in hardware. This approach has the advantage that no delays in the calculation of the check matrix occur and therefore the error detection is efficient.

If a code word is very long and consists of multiple data words, for example, in the word length of the connected CPU, it may be advantageous to perform the computation of the syndrome iteratively with the read or written data words. The mathematical properties of cyclic algebraic codes allow such a recursive evaluation of the syndrome. This allows the data rates of error detection and the read speed of the memory and the buses to be adjusted to match each other. In this case, the hardware for processing a data word can additionally be used multiple times (reused). The so-called Horner scheme may be used to evaluate a polynomial.

In the following, let $$u=(u_{d-1}, \ldots, u_0) \in \{0,1\}^d$$

be a message in binary form and let $$g(x) \in GF(2)[x]$$

be the generator polynomial of a cyclic algebraic code. The notation GF(2)[x] means that the formal element x is adjoined to the field GF(2), resulting in the polynomial ring in the unknown x. GF(2) is a field with 2 elements and g is a polynomial.

When calculating the syndrome of the message u, the message $$u=(u_{d-1}, \ldots, u_0)$$

is interpreted as the polynomial $$u(x)=u_{d-1}x^{d-1}+\ldots+u_1x+u_0 \in GF(2)[x]$$

of degree d−1 and the syndrome, for example, is calculated as the uniquely defined remainder $$r(x)=u(x)x^{deg(g)} \bmod g(x)$$

of the polynomial division of the associated polynomial of the message u(x) and the generator polynomial g(x), where deg(g) specifies the degree of the generator polynomial g(x).

A coefficient vector of the polynomial $$m(x)=u(x)x^{deg(g)}+r(x)$$

forms the systematically coded code word, associated with the message u, $$m=(m_{n-1}, \ldots, m_0).$$

By design, $$m(x) \bmod g(x)=0$$

over GF(2)[x].

An example implementation of a hardware unit for calculating the syndrome can be provided, for example, by means of a linear feedback shift register (LFSR) with the generator polynomial of the code g(x) as the feedback function.

When the message u is bit-wise shifted (starting with the most-significant bit (MSB) of the message u and the LFSR in an initial state of $0^{deg(g)}$) into the LFSR, the register finally contains the desired coefficients of the remainder r(x) as a result. It should be noted that "$0^{deg(g)}$" denotes a symbol string consisting of a number deg(g) of "0" digits.

Implementation using LFSR requires little hardware. However, this procedure has the disadvantage that the message u is only processed bit-wise and therefore the calculation takes a relatively long time. In addition, the bits must be processed in a fixed sequence, starting from the most significant bit.

If the message is processed in data words $$u=(w_{z-1}, \ldots, w_0)$$

with $w_j \in \{0,1\}^b$ for $0 \leq j < z$ of width b (thus: d=zb), the so-called Homer scheme can be used to calculate the syndrome. Here d denotes the length of the message u in bits. To simplify matters, it was assumed that the length of the message is a multiple of the width b. If this is not the case, the message can be appropriately extended (padding) before processing.

For simplification, it is assumed below that b≥deg(g) applies. The algorithm of a (simplified) Homer scheme is as follows (also referred to below as "Algorithm 1"):

| 1. | $r \leftarrow 0^{deg(g)}$ |
| 2. | for i ← z−1 downto 0 do |
| 3. | $r \leftarrow M^*(r \oplus w_i)$ |
| 4. | od |

In this case, the operator $\oplus$ refers to the component-by-component addition to vectors over GF(2), the operator * the standard product of matrix and column vector and M $\in$ $GF(2)^{deg(g) \times b}$ references a matrix, which in its i-th column contains the coefficient vector of the reduced remainder of the polynomial division $$x^{b+deg(g)-i} \bmod g(x)$$

for 1≤i≤deg(g).

Thus, for an arbitrary symbol sequence (also referred to as a string) a $\in \{0,1\}^b$ and its associated polynomial represented by the coefficient vector a $$a(x) \in GF(2)[x],$$

it follows that $$(M^*a)(x)=a(x)x^b \bmod g(x)$$

where * denotes the standard product of a matrix and column vector. The product $M^*(x \oplus w_i)$ with the matrix M calculated in Algorithm 1 can be expressed as XOR sums of bits of the vectors r and $w_i$ and implemented as a combinatorial circuit.

After Algorithm 1 described in the pseudo-code has completed, the variable r contains the coefficient vector of the syndrome $$r(x)=u(x)x^b \bmod g(x).$$

If b>deg(g) is true, the coefficient vector r must be suitably padded with leading 0 bits up to the length b.

An advantage of this variant is that no additional latencies occur, because the speed of the data processing can be adjusted to match the read speed of the memory and the buses. Due to the iterative use of the matrix M, which can be implemented as a combinatorial circuit of XOR gates, the hardware complexity of the solution may be manageable to low. However, this approach may require the data words $w_i$ (with i=z−1, . . . , 0) to be processed in a fixed sequence starting from the most significant data word $w_{z-1}$. Alternatively, the computation of the syndrome can be performed in parallel in hardware. This approach is particularly interesting for wide data buses, but has disadvantages in terms of hardware overhead and power consumption.

In another alternative for 1-bit error correction, each data word $w_i$ may be equipped with a 1-bit error code, i.e. a single parity bit. In addition, the XOR sum of the error correction codes of the individual data words is stored as the error correction code of the code word. When reading the data words, the parity bit may be first used to check whether a 1-bit error is present in at least one of the data words $w_i$. If not, the word can be processed immediately, otherwise all data words of the code word may be read, the respective error correction codes of the individual data words may be calculated and summed in binary form. If only a single data word has an incorrect parity bit, the difference between the calculated sum and the sum contained in the code word may be the syndrome of the incorrect data word. This method may not be efficient for multi-bit error correction, as the costs incurred in detecting possible multi-bit errors of the individual data words within the code word increase linearly with the number of data words.

Random Access

The following examples also show, in particular, how an iterative syndrome calculation of a bit string given by multiple data words (as used, for example, in the evaluation according to the Horner scheme from Algorithm 1) can be combined with random access to the data words.

Thus, the approach proposed here does not require a fixed sequence for processing the data words in the syndrome calculation. In this way, the benefits of reduced hardware overhead and energy-efficient implementation can be combined with random access to the data words to be processed.

When implementing random access to the data words, different levels are possible:

A user can access all data words in any order.

A user can start with any data word of a bit string and then access the remaining data words cyclically in ascending or descending order, possibly with a wrap-around (i.e. a cyclic wrap-around) at the edges of the bit string.

A user can start with any data word of a subset to be determined of all data words of a bit string and then access the remaining data words cyclically in ascending or descending order, possibly with a wrap-around at the edges of the bit string.

In order to process data words of a given bit string during the calculation of a syndrome in a different order than that determined by the Horner scheme in Algorithm 1, different matrices $$M_j \in GF(2)^{deg(g) \times b}$$

are used. The matrices correct intermediate results of the calculation when the evaluation sequence of the data words changes.

For a given sequence of data words $$u=(w_{z-1}, \ldots, w_0)$$

with $w_i \in \{0,1\}^b$ for $0 \leq i < z$ Algorithm 1 calculates the value $$r = M^*(\ldots(M^*(M^*w_{z-1}+w_{z-2})\ldots+w_0) = M^z * w_{z-1} + M^{z-1} * w_{z-2} + \ldots + M^* w_0.$$

If the i-th column of the matrix M contains the coefficient vector of the reduced remainder of the polynomial division $$x^{b+deg(g)-i} \bmod g(x) \text{ for } 1 \leq i \leq deg(g)$$

the corresponding polynomial r(x) of the coefficient vector r is given by $$r(x) = (w_{z-1}x^{zb} + w_{z-2}x^{(z-1)b} + \ldots + w_0 x^b) \bmod g(x).$$

The data word with the index $0 \leq j < z$ is assigned a monomial $x^{jb}$. If the evaluation sequence of the data words is modified during the calculation of the syndrome, suitable matrices $$M_k \in GF(2)^{deg(g) \times b}$$

must be used to correct the intermediate results.

Here $M_k \in GF(2)^{deg(g) \times b}$ refers to a matrix, the i-th column of which contains the coefficient vector of the reduced remainder of the polynomial division $$x^{k+deg(g)-i} \bmod g(x) \text{ for } 1 \leq i \leq deg(g)$$

for a given integer k.

The following example is given for illustration purposes: taking the generator polynomial as $$g(x) = x^4 + x^3 + x + 1 \in GF(2)[x]$$

with k=10 and a width b=4, deg(g)=4 and i=1, ..., 4 the result is:

$$x^{10} = (x^6 + x^5 + x^4 + 1) * g(x) + x^3 + x + 1$$

$$x^{11} = (x^7 + x^6 + x^5 + x + 1) * g(x) + x^3 + x^2 + 1$$

$$x^{12} = (x^8 + x^7 + x^6 + x^2 + x + 1) * g(x) + 1$$

$$x^{13} = (x^9 + x^8 + x^7 + x^3 + x^2 + x) * g(x) + x$$

The matrix $M_6 \in GF(2)^{4 \times 4}$ then has the form:

$$\begin{pmatrix} 0 & 0 & 1 & 1 \\ 0 & 0 & 1 & 0 \\ 1 & 0 & 0 & 1 \\ 0 & 1 & 1 & 1 \end{pmatrix}$$

Because the algebraic codes used are cyclic, there will always be a number n>0 with the property $$x^n = x^{-1} \bmod g(x).$$

This means that by multiplying by suitably chosen matrices $M_k$ the intermediate results of the calculation of the Horner scheme can be multiplied by arbitrary powers of x or divided by arbitrary powers of x.

These operations correspond to rotations of the sequence of the processed data words to the left or right, and allow the data words to be processed in any order. In all actual cases, the matrix multiplication over GF(2) in the hardware implementation can be reduced to the calculation of XOR sums of coefficients of the respective bit vectors.

Example: Access taking into account a sequence J

In the following, the message u is specified as a sequence of data words $$u=(w_{z-1}, \ldots, w_0) \text{ with } w_i \in \{0,1\}^b \text{ for } 0 \leq i < z$$

of width b. If the length of the original message is not a multiple of the width b of the data words, the message is advantageously first extended using a suitable padding method. Furthermore, $$M_k \in GF(2)^{deg(g) \times b}$$

denotes a matrix, the i-th column of which contains the coefficient vector of the reduced remainder of the polynomial division $$x^{k+deg(g)-i} \bmod g(x) \text{ for } 1 \leq i \leq deg(g)$$

for a given integer k.

Thus, for an arbitrary symbol string $a \in \{0,1\}^b$ and its associated polynomial represented by the coefficient vector a $$a(x) \in GF(2)[x],$$

it follows that $$(M_k * a)(x) = a(x) x^k \bmod g(x)$$

where the operation * denotes the standard product of the matrix and column vector.

Furthermore, let $$J=(j(0), \ldots j(z-1))$$

be an arbitrary access sequence to the words of the message u with $0 \leq j(i) < z$ and $0 \leq i < z$. The following shows an example of an algorithm in pseudo-notation that allows random access in the sequence J (this algorithm is also called "Algorithm 2"):

```
1.      r ← 0^deg(g)
2.      p ← 0
3.      for i ← 0 to z-1 do
4.          r ← M_{b(j(i)-p)}*(r ⊕ w_{j(i)})
5.          p ← j(i)
6.      od
7.      r ← M_{-bp}*r
```

The procedure allows any access sequence in fact, but has the disadvantage that for all values $$k \in \{-(z-1)b, -(z-2)b, \ldots, -b, 0, b, \ldots, (z-2)b, (z-1)b\}$$

suitable matrices $M_k$ must be allocated.

Also, if after step 6 it is determined that $r \neq 0^{deg(g)}$ applies (i.e. an error has been detected), the calculation of step 7 must be carried out first in order to obtain the syndrome value of message u in normalized form.

In step 7, the powers of x that are left over by the position of the last data word $j(z-1)$ as an additional factor in r after step 6 are removed again.

Example: Access cyclically ascending, starting at k:

In a design variant, the calculation of the syndrome value of the message $$u=(w_{z-1}, \ldots, w_0)$$

begins with the data word $0 \leq k < z$ with incrementally increasing index until the word $w_{z-1}$ and subsequent wrap-around $z-1 \to 0$.

The following shows an example of an algorithm in pseudo-notation that allows cyclically ascending, random access starting at k (this algorithm is also called "Algorithm 3"):

```
1.      r ← 0^deg(g)
2.      p ← k
3.      for i ← 0 to z-1 do
4.          if p = z-1 then /* wrap-around */
5.              r ← M_{(z-1)b}*(r ⊕ w_p)
6.              p ← 0
7.          else
8.              r ← M_{-b}*(r ⊕ w_p)
9.              p ← p+1
10.         fi
11.     od
12.     r ← M_{kb}*r
```

The procedure requires only two matrices $M_{-b}$ and $M_{(z-1)b}$ in the algorithm's for-loop.

The multiplication by the matrix $M_{-b}$ corresponds to a modular division of the interim result r by $$x^b \text{ modulo } g(x)$$

and the multiplication by the matrix $M_{(z-1)b}$ corresponds to a modular multiplication of the interim result r by $$x^{(z-1)b} \text{ modulo } g(x).$$

As in Algorithm 2, in Algorithm 3 for the syndrome of an error-free, systematically coded code word, r=0 is true after step 11.

If an error has been detected instead, only the calculation according to step 12 must be carried out in order to obtain the syndrome value of message u in normalized form. If step 12 is implemented as a multiplication iterated k times with the matrix $M_b$, only one additional matrix needs to be allocated for step 12.

In a similar way, the syndrome can be calculated with an incrementally decreasing index up to word $w_0$ and wrap-around $0 \to z-1$. In this case, the matrix $M_b$ is used for the incremental step and the matrix $M_{-zb}$ is used for the wrap-around step.

Example: Access ascending starting at k and descending starting at k−1:

In a further variant, the calculation of the syndrome value of the message $$u=(w_{z-1}, \ldots, w_0)$$

begins with the data word $0 \leq k < z$ with an incrementally rising index up to word $w_{z-1}$ and then with incrementally falling index from k−1 to word $w_0$.

The following shows an example of an algorithm in pseudo-notation that allows rising random access starting at k−1 and descending starting from k−1 (this algorithm is also called "Algorithm 4"):

```
1.      r_up ← 0^deg(g)
2.      for i ← k to z-2 do
3.          r_up ← M_{-b}*(r_up ⊕ w_i)
4.      od
5.      r_up ← M_{(z-1)b}*(r_up ⊕ w_{z-1})
6.      r_down ← 0^deg(g)
7.      for i ← k-1 downto 0 do
8.          r_down ← M_b*(r_down ⊕ w_i)
9.      od
10.     r ← r_up ⊕ r_down
```

This implementation requires three matrices $M_{-b}$, $M_b$ and $M_{(z-1)b}$.

Algorithm 4 has the advantage that after step 10, r already contains the coefficient vector of the syndrome value and no further correction steps are necessary. This can be explained as follows: after step 5, a data word with index $k \leq q < z$ has a coefficient $$x^{-(z-2-q+1)b+zb} = x^{(q+1)b}.$$

From step 7 on, for data words with index $0 \leq q < k$ the loop corresponds to the normal evaluation of a polynomial expression according to the Horner scheme from Algorithm 1. With a specific implementation in hardware, an additional advantage is that the final bit-wise addition in step 10 can be implemented in such a way that this step requires no program code or explicit change of state of a finite automaton. The XOR operation can be calculated on-the-fly by a combinatorial circuit and causes only a relatively small increase in the latency of this circuit component.

One option involves optimizing the matrices required to calculate the syndrome (including any correction matrices required for a modified access sequence) by suitable choice of the representation of the finite field used and/or the generator polynomial for the algebraic code that is used, so that the weight of individual or all matrices used (i.e. the number of non-zero entries) is minimized. This can reduce the size of the resulting circuit and the power consumption. Alternatively or additionally, the weight of the columns of individual or all matrices used can also be minimized. The maximum column weight contributes to the latency of the resulting circuit and therefore limits the maximum execution speed.

The exemplary embodiments and variants described here have only been described by means of cyclic algebraic codes over GF(2) for ease of illustration. The techniques described can be applied in the same way to other codes, such as Reed-Solomon codes or other finite fields or extension fields, such as GF(q) or GF($2^n$).

Figure 2:
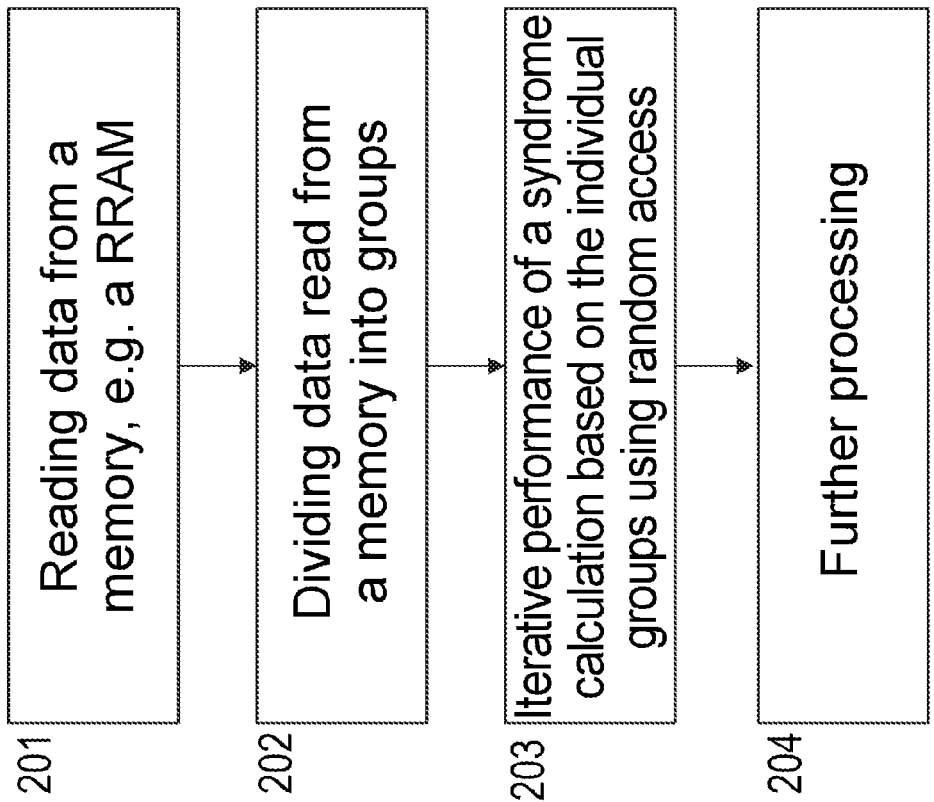
FIG. 2 an example diagram of steps of a method which can be carried out e.g. on the processing unit described in FIG. 1.

FIG. 2 shows an example diagram with steps of a method which can be performed e.g. on the processing unit 103 described in FIG. 1.

In a step 201, data is read from a memory, in particular a non-volatile memory, such as an RRAM.

In a step 202, the read data is divided into groups.

In a step 203, a syndrome calculation is carried out iteratively based on the individual groups. The syndrome calculation is carried out by means of random access to the individual groups. This means that the chosen sequence of the groups in the syndrome calculation can be different from the specified order of the groups, i.e. at least two adjacent groups are not processed in direct succession.

Based on this iterative syndrome calculation, an error syndrome is determined which is used to determine whether a code word is present or not. If there is no code word present, error detection and/or error correction is performed. If the error can be corrected, the corrected data is processed further. If the error was detected but is not corrected, a message can be issued, for example, that an error is present.

In a step 204, the result of the error detection or the error-free data is processed further.

Although the disclosure has been illustrated and described in detail by means of the at least one exemplary embodiment shown, the disclosure is not restricted thereto and other variations can be derived therefrom by the person skilled in the art without departing from the scope of protection of the disclosure.

What is claimed is:

1. A method for processing data read from memory, comprising
 dividing read data into groups; and
 performing a syndrome calculation iteratively based on each of the groups;
 wherein the syndromes are calculated using random access to the groups, for detecting and/or correcting errors in the data and thus increasing the reliability of the data read from memory and achieving a reduction of the memory's error rate;
 wherein using random access to the groups comprises accessing data words in any order, starting with any data word of a bit string, and then accessing the remaining data words cyclically in ascending or descending order, wherein the method is performed in a microprocessor, semiconductor circuitry or processing unit.

2. The method as claimed in claim 1, further comprising:
 determining an error syndrome based on the iterative syndrome calculation;
 determining from the error syndrome whether a code word is present; and
 if no code word is present, detecting and/or correcting an error.

3. The method of claim 1, wherein the random access to the groups comprises accessing the groups in an arbitrary order.

4. The method of claim 1, wherein the random access to the groups comprises first processing a group that does not contain either a first bit or a last bit of the read data.

5. The method of claim 1, wherein the random access to the groups comprises accessing the groups cyclically in ascending order or descending order, and performing a cyclic wrap-around at an end of the read data.

6. The method of claim 1, wherein the random access to the groups comprises accessing the groups cyclically in ascending order and descending order.

7. The method as claimed in claim 6, further comprising performing a cyclic wrap-around at an end of the read data.

8. The method of claim 1, wherein the syndromes are calculated using at least one correction matrix.

9. The method as claimed in claim 8, wherein performing the syndrome calculation comprises determining syndromes of a cyclical code.

10. The method of claim 8, wherein performing a syndrome calculation comprises using a correction matrix $M_k$ for each group, wherein each correction matrix corresponds to syndromes of symbol strings rotated by a specified number of positions.

11. The method of claim 8, wherein the syndromes are calculated iteratively based on each of the individual groups by using a correction matrix $M_k$ for each group, wherein the i-th column of the correction matrix $$M_k \in GF(2)^{deg(g) \times b}$$

contains a coefficient vector of the reduced remainder of the polynomial division $$x^{k+deg(g)-i} \bmod g(x) \text{ for } 1 \leq i \leq deg(g)$$

for a given integer k.

12. The method of claim 1, in which the memory is a non-volatile RRAM memory.

13. The method of claim 1, in which the memory is part of an electronic security circuit.

14. A device for processing data read from a memory, comprising:
 a memory, configured to store data;
 a microprocessor, semiconductor circuitry, or processing unit configured to:
 read the data from the memory;
 divide the data into groups; and
 iteratively calculate a syndrome based on each of the groups using random access to the groups;
 wherein using random access to the groups comprises the processor accessing data words in any order, starting with any data word of a bit string, and then accessing the remaining data words cyclically in ascending or descending order; and
 wherein the microprocessor, semiconductor circuitry, or processing unit iteratively calculating the syndrome comprises the microprocessor, semiconductor circuitry, or processing unit iteratively calculating the syndrome using random access to the groups, for detecting and/or correcting errors in the data and thus increasing the reliability of the data read from the memory and achieving a reduction of the memory's error rate.

15. The device as claimed in claim 14, in which the device is an electronic security circuit and the memory is part of the device.

16. A non-transitory computer readable medium, comprising instructions which, if executed, cause one or more processors to:
 process data read from a memory, in which the data is divided into groups;
 calculate a syndrome iteratively based on each of the individual groups, the syndromes being calculated by means of random access to the individual groups.

* * * * *